United States Patent
Ding et al.

(10) Patent No.: US 11,355,409 B2
(45) Date of Patent: Jun. 7, 2022

(54) CHIP PACKAGE WITH EMITTER FINGER CELLS SPACED BY DIFFERENT SPACINGS FROM A HEAT SINK TO PROVIDE REDUCED TEMPERATURE VARIATION

(71) Applicant: GlobalFoundries U.S. Inc., Santa Clara, CA (US)

(72) Inventors: Hanyi Ding, Colchester, VT (US); Vibhor Jain, Essex Junction, VT (US); Alvin J. Joseph, Williston, VT (US); Anthony K. Stamper, Williston, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/405,325

(22) Filed: May 7, 2019

(65) Prior Publication Data

US 2019/0267304 A1 Aug. 29, 2019

Related U.S. Application Data

(63) Continuation of application No. 14/745,800, filed on Jun. 22, 2015, now abandoned.

(51) Int. Cl.
| | |
|---|---|
| *H01L 29/66* | (2006.01) |
| *H01L 23/367* | (2006.01) |
| *H01L 29/08* | (2006.01) |
| *H01L 21/48* | (2006.01) |
| *H01L 29/417* | (2006.01) |
| *H01L 29/732* | (2006.01) |

(52) U.S. Cl.
CPC ........ *H01L 23/367* (2013.01); *H01L 21/4882* (2013.01); *H01L 29/0804* (2013.01); *H01L 29/41708* (2013.01); *H01L 29/66272* (2013.01); *H01L 29/732* (2013.01)

(58) Field of Classification Search
CPC .......... H01L 29/0817; H01L 29/66303; H01L 29/66242; H01L 2924/13051
See application file for complete search history.

(56) References Cited

U.S. PATENT DOCUMENTS

| | | | |
|---|---|---|---|
| 5,616,950 | A | 4/1997 | Liu |
| 5,734,193 | A | 3/1998 | Bayraktaroglu et al. |
| 6,316,827 | B1 | 11/2001 | Asano et al. |
| 6,534,857 | B1 | 3/2003 | Morse |

(Continued)

FOREIGN PATENT DOCUMENTS

JP 09181086 A 7/1997

OTHER PUBLICATIONS

Ning Hu et al., "Improved thermal stability of power SiGe heterojunction bipolar transistor with novel emitter structure," 2009 IEEE 8th International Conference on ASIC, Changsha, Hunan, 2009, pp. 1027-1030.

*Primary Examiner* — Anh D Mai
(74) *Attorney, Agent, or Firm* — Thompson Hine LLP; Anthony Canale

(57) ABSTRACT

Chip packages and methods of forming a chip package. The chip package includes a power amplifier and a thermal pathway structure configured to influence transport of heat energy. The power amplifier includes a first emitter finger and a second emitter finger having at least one parameter that is selected based upon proximity to the thermal pathway structure.

6 Claims, 8 Drawing Sheets

(56) References Cited

U.S. PATENT DOCUMENTS

| | | | |
|---|---|---|---|
| 7,622,756 B2* | 11/2009 | Sasaki | H01L 23/66 |
| | | | 257/205 |
| 7,705,425 B2 | 4/2010 | Ma et al. | |
| 8,203,185 B2 | 6/2012 | Sriram | |
| 2005/0127399 A1 | 6/2005 | Meadows | |
| 2006/0244012 A1 | 11/2006 | Wang | |
| 2008/0230807 A1* | 9/2008 | Kuroda | H01L 27/0605 |
| | | | 257/197 |
| 2016/0372548 A1 | 12/2016 | Ding et al. | |

* cited by examiner

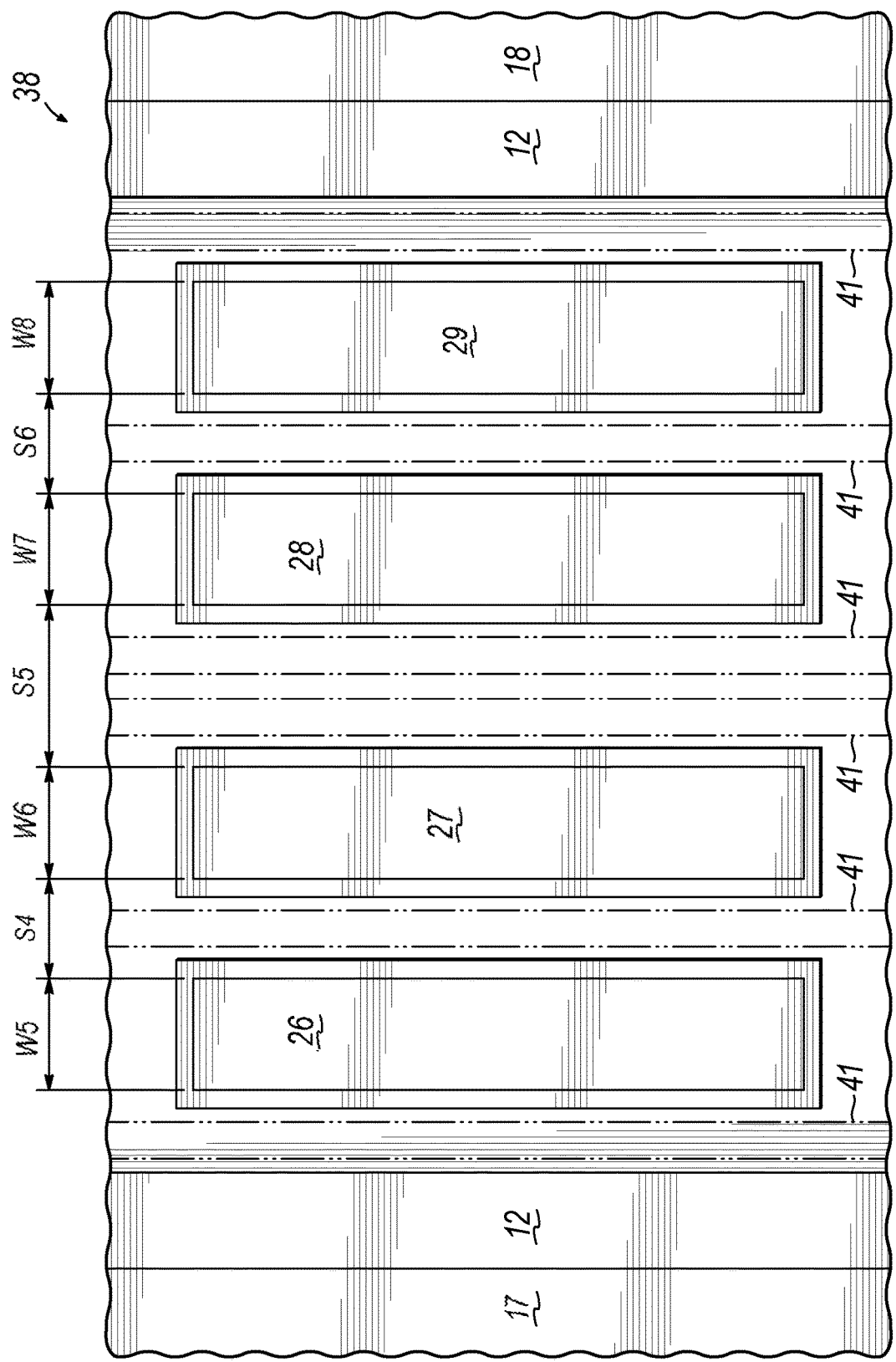

CHIP PACKAGE WITH EMITTER FINGER CELLS SPACED BY DIFFERENT SPACINGS FROM A HEAT SINK TO PROVIDE REDUCED TEMPERATURE VARIATION

BACKGROUND

The invention relates generally to semiconductor devices and integrated circuit fabrication and, in particular, to chip packages and methods of forming a chip package.

Bipolar junction transistors may be found, among other end uses, in chips for high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased, the base-collector junction is reverse biased, and the collector-emitter current may be controlled by the base-emitter voltage.

Packaging is one of the final steps in the process of manufacturing chips. In packaging, a fabricated chip is mounted within a protective housing. Packaging must consider heat transfer needs and, in particular, the need to adequately transfer heat out the package.

Improved chip packages and methods of forming a chip package are needed.

SUMMARY

In an embodiment of the invention, a method is provided for forming a chip package. A chip is formed that includes a device structure with a first emitter finger and a second emitter finger. The first emitter finger and the second emitter finger having at least one parameter. A thermal pathway structure is formed that is configured to influence transport of heat energy emitted from the first emitter finger and the second emitter finger. The at least one parameter for the first emitter finger and the second emitter finger is selected based upon proximity to the thermal pathway structure.

In an embodiment of the invention, a chip package includes a power amplifier and a thermal pathway structure configured to influence transport of heat energy. The power amplifier includes a first emitter finger and a second emitter finger having at least one parameter that is selected based upon proximity to the thermal pathway structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 3 and 4 are top views of one of the cells of the device structure of FIGS. 1, 2, 2A in accordance with alternative embodiments of the invention.

DETAILED DESCRIPTION

Figure 1:
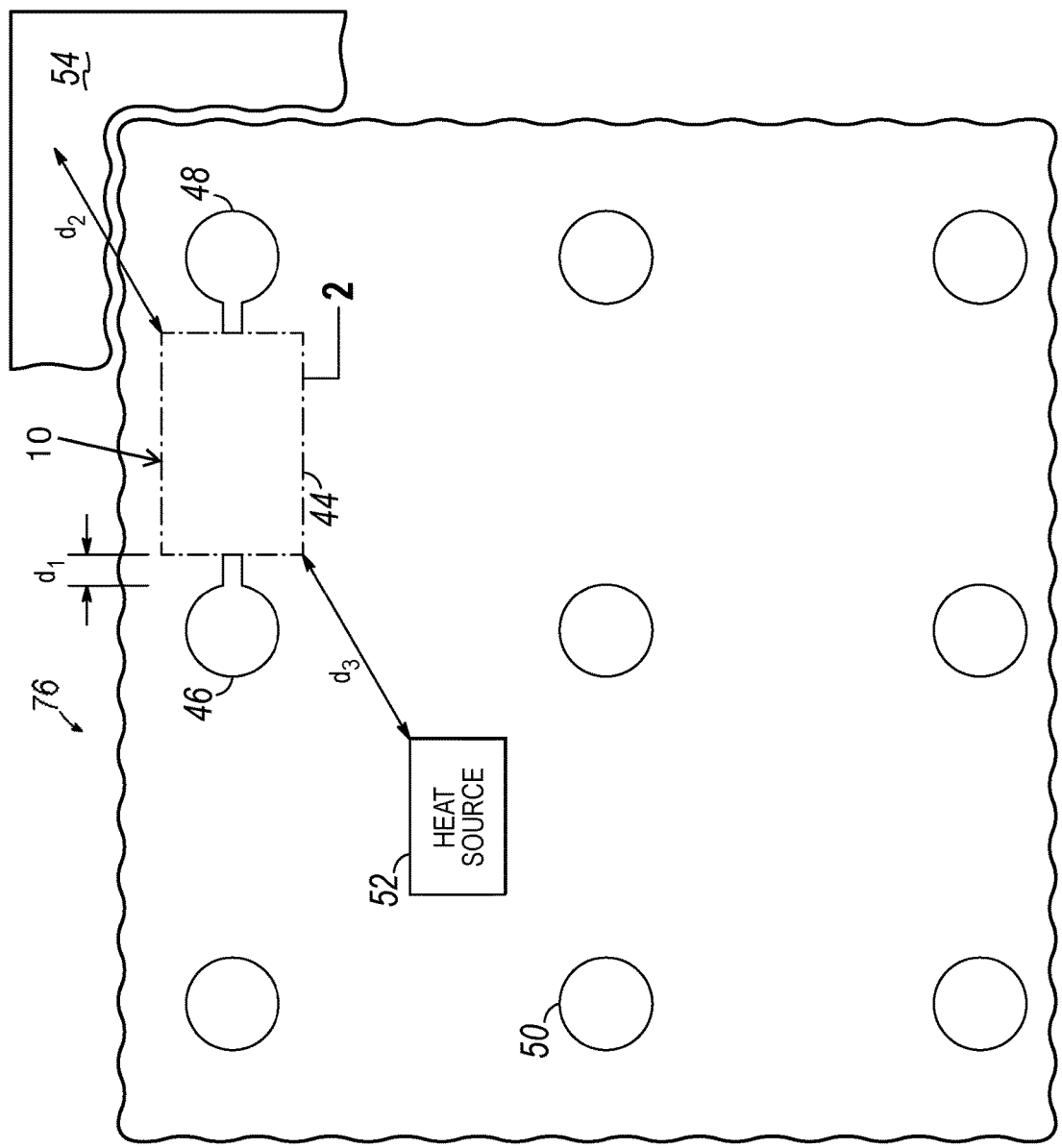
FIG. 1 is a diagrammatic view of a package and a chip in accordance with an embodiment of the invention.
Figure 2:
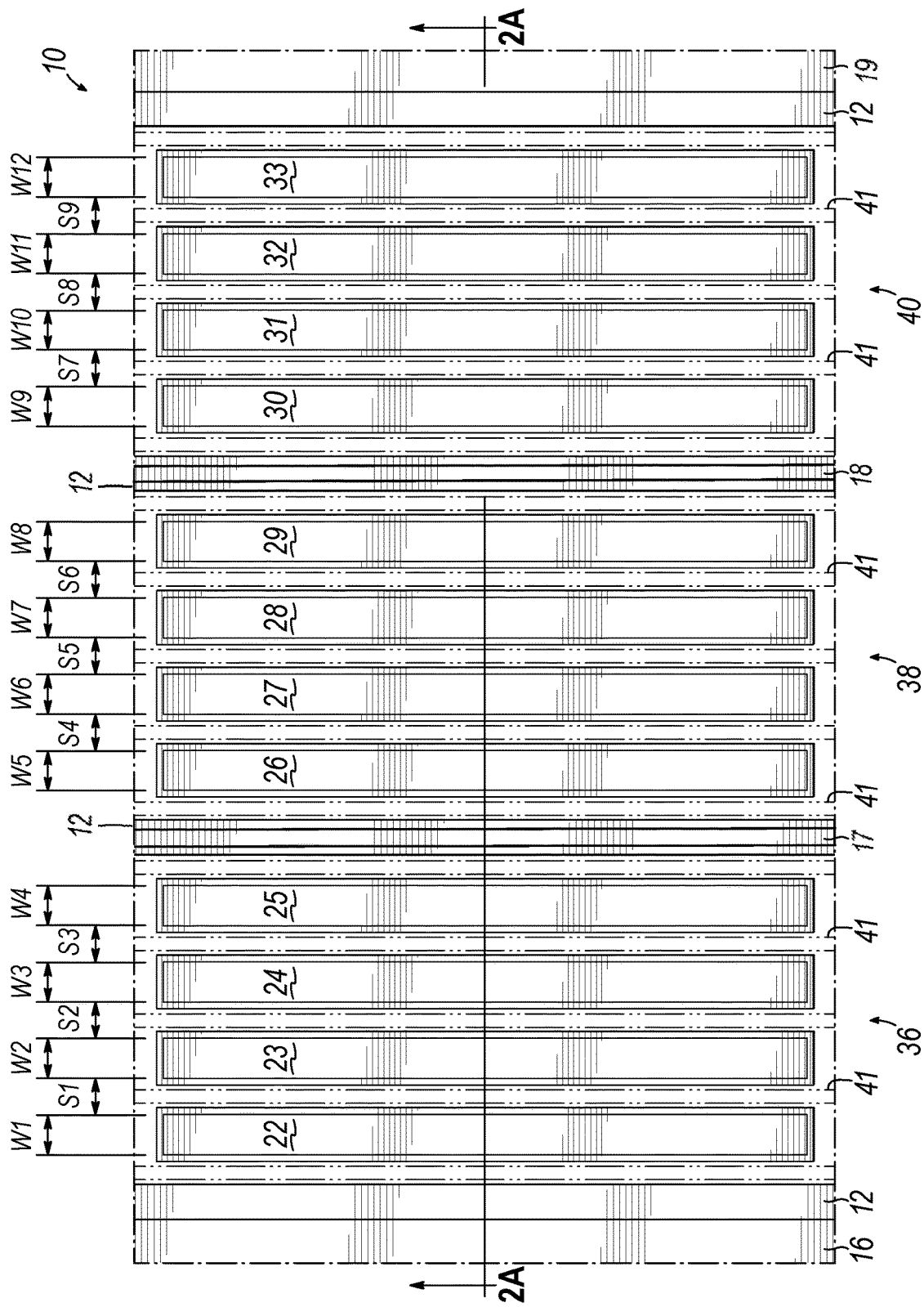
FIG. 2 is a top view of the device structure located in an area on the chip of FIG. 1 in accordance with an embodiment of the invention.
Figure 2A:
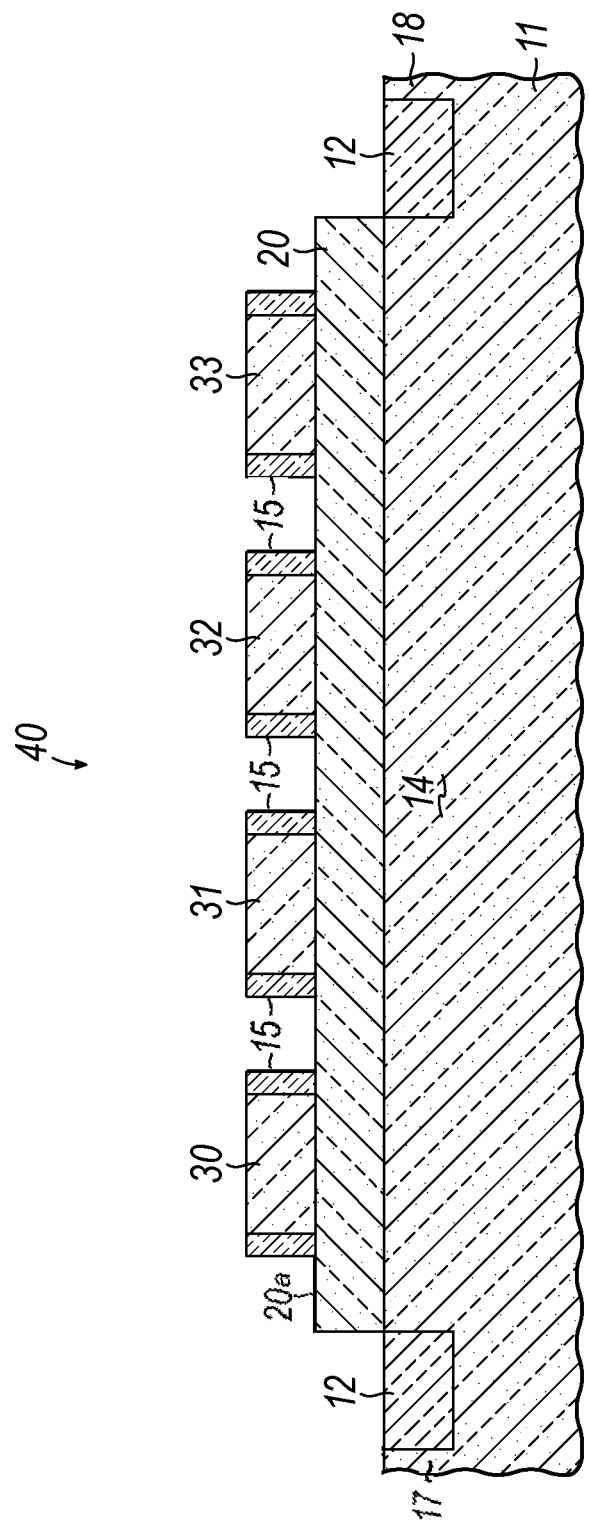
FIG. 2A is a cross-sectional view taken generally along line 2A-2A in FIG. 2.

With reference to FIGS. 1, 2, 2A and in accordance with an embodiment of the invention, a device structure 10 may be located in an area 44 on a chip 76 formed using a substrate 11. The chip 76 may include heat sinks 46, 48, 50 and one or more heat sources 52. The chip 76 may be assembled for use in an end product in chip packaging, which includes a package element 54.

In an embodiment, the heat sinks 46, 48, 50 may comprise through-substrate vias extend through the entire thickness of the substrate 11. Through-substrate vias may be fabricated by deep reactive ion etching or laser drilling a deep via into the substrate 11, electrically insulating the deep via with a dielectric material, lining the via with a conductive liner that is a diffusion barrier and/or adhesion promoter, and filling the via with a conductor such as a metal (e.g., copper). After the vias are filled, the substrate 11 may be thinned from its back side by grinding and/or a wet or dry etch to reduce its original thickness and thereby expose the opposite end of each through-substrate via at the depth of the vias. The through-substrate vias provide continuous conductive paths through the substrate 11 for signals, power, and/or ground, as well as paths for thermal conduction.

In another embodiment, the heat sinks 46, 48, 50 may comprise conductive pillars. Conductive pillars may be fabricated by electroplating a metal, such as copper, onto a final metal pad in a top level of the interconnect structure of the chip 76. A plating resist may provide the placement of the conductive pillars relative to the final metal pads. The conductive pillars may be topped by solder caps. The conductive pillars provide continuous conductive paths for signals, power, and/or ground, as well as paths for thermal conduction.

The heat sources 52 comprise devices on the chip 76 that generate heat when the chip 76 is powered. For example, the heat sources 52 may comprise passive devices in the interconnect structure of the chip 76 or active devices on the substrate 11.

The chip packaging, which includes the package element 54, protects the chip 76 from physical damage and external stresses. In addition, the chip packaging can provide thermal conductance paths to efficiently remove heat generated in the chip 76, and also provide electrical connections to other components such as printed circuit boards. Materials used for chip packaging typically comprise ceramic or plastic, and form-factors such as ceramic flat packs, dual in-line packages, pin grid arrays, leadless chip carrier packages, etc.

The emitter fingers 22-25, 26-29, and 30-33 of the device structure 10 may be located on the chip 76 at a given distance from the package element 54 of the chip packaging. The package element 54 may be comprised of a thermal insulator characterized by a low thermal conductivity. The package element 54 restricts the transport of heat energy across its boundary in the chip packaging. The package element 54 may comprise, as examples, a glass-reinforced epoxy laminate to which the chip 76 is attached, an underfill material beneath the chip 76 in the package, or a polymer (e.g., an epoxy mold compound) comprising a molded packaging material of the package.

As best shown in FIGS. 2, 2A, the substrate 11 may comprise a single-crystal semiconductor material usable to form the devices of an integrated circuit. For simplicity, the device structure 10 does not show some details associated with a typical SiGe HBT or other NPN transistor types. The semiconductor material constituting the substrate 11 may include an epitaxial layer at its top surface, which may contain an amount of an electrically-active dopant that enhances its electrical properties relative to the remainder of the substrate 11. For example, the substrate 11 may include an epitaxial layer of single crystal silicon that is doped with a concentration of, in a construction for an NPN transistor, an n-type dopant from Group V of the Periodic Table (e.g., phosphorus (P), arsenic (As), or antimony (Sb)) in a concentration effective to impart n-type conductivity.

Shallow trench isolation regions 12 are located in the semiconductor material of the substrate 11. The shallow trench isolation regions 12 define the bounds of, and furnish electrical isolation for, each emitter finger relative to the adjacent ones through the collector 14. In certain embodiments, the trench isolation regions 12 may be omitted from internal emitter finger regions to improve thermal dissipation.

Deep trench isolation regions 13 are located in the semiconductor material of the substrate 11. The trench isolation regions 13 define the bounds of, and furnish electrical isolation for, the collector 14 and collector contact regions 16-19, which are each comprised of the semiconductor material of the substrate 11 to the adjacent devices. The collector contact regions 16-19 are positioned adjacent to the collector 14, and are laterally separated from the collector 14 by the shallow trench isolation regions 12. The collector contact regions 16-19 are coupled with the collector 14 by portions of the semiconductor material of the substrate 11 positioned beneath the shallow trench isolation regions 12. Typically, the deep trench isolation regions 13 are 3 um to 6 um deep relative to the top surface of the substrate 11 and are filled with one or more dielectric materials. In certain embodiments, the deep trench isolation regions 13 may be omitted from the collector boundary regions and replaced with shallow trench isolation regions 12 for better thermal dissipation.

The shallow trench isolation regions 12 may be formed by depositing a hardmask, patterning the hardmask and substrate 11 with lithography and etching processes to define trenches, depositing an electrical insulator to fill the trenches, planarizing the electrical insulator relative to the hardmask using a chemical mechanical polishing (CMP) process, and removing the hardmask. In one embodiment, the shallow trench isolation regions 12 may be comprised of silicon dioxide ($SiO_2$) deposited by chemical vapor phase deposition (CVD).

The deep trench isolation regions 13 may be formed by depositing a hardmask, patterning with lithography and etching processes to define trenches through the shallow trench region 12 and substrate 11, depositing an electrical insulator to fill the trenches, planarizing using a chemical mechanical polishing (CMP) process, and removing the hardmask. In one embodiment, the trench isolation regions 13 may be comprised of silicon dioxide ($SiO_2$) deposited by chemical vapor phase deposition (CVD).

The chip 76 includes a device structure 10 that is formed using the semiconductor material of the substrate 11. A base layer 20 of the device structure 10 is located on a top surface of the substrate 11. The base layer 20 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 20 may be uniform across the thickness of base layer 20, or graded and/or stepped across the thickness of base layer 20. If the germanium content is stepped, respective thicknesses of the base layer 20 that are directly adjacent to the substrate 11 and directly adjacent to the subsequently-formed emitter fingers may lack a germanium content and may therefore constitute intrinsic layers comprised entirely of silicon. The base layer 20 may comprise a dopant, such as a p-type dopant selected from Group III of the Periodic Table (e.g., boron) in a concentration that is effective to impart p-type conductivity to the constituent semiconductor material and, optionally, carbon (C) to suppress the mobility of the p-type dopant.

The base layer 20 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) is epitaxially grown or deposited by the low temperature epitaxial growth process on the top surface of substrate 11. The base layer 20 may have an epitaxial relationship with the single crystal semiconductor material of the substrate 11 in which the crystal structure and orientation of the substrate 11 operates as a template to establish the crystal structure and orientation of the base layer 20 during growth.

An emitter of the device structure 10 is collectively comprised of a plurality of emitter fingers 22-25, 26-29, and 30-33 that are located on the top surface 20a of the base layer 20. The emitter fingers 22-25, 26-29, and 30-33 may be comprised of a semiconductor material than differs in composition from the semiconductor material of the base layer 20 and that has an opposite conductivity type from the semiconductor material of the base layer 20. For example, the composition of the material comprising the emitter fingers 22-25, 26-29, and 30-33 may be comprised of silicon and lack germanium that is present in at least a portion of the base layer 20, and may contain an n-type dopant in a concentration effective to impart n-type conductivity. In a representative embodiment, the semiconductor material comprising the emitter fingers 22-25, 26-29, and 30-33 may be n-type polysilicon (i.e., n-type polycrystalline silicon) deposited by chemical vapor deposition.

To form the emitter fingers 22-25, 26-29, and 30-33, a mask layer may be applied on a top surface of a deposited layer (e.g., n-type polysilicon) and patterned with photolithography. Specifically, a mask layer is applied that includes stripes are covering the deposited layer at the intended location of the emitter fingers 22-25, 26-29, and 30-33 to be subsequently formed. To that end, the mask layer may comprise a light-sensitive material, such as a photoresist, that is applied as a coating by a spin coating process, pre-baked, exposed to light projected through a photomask, baked after exposure, and developed with a chemical developer to pattern an etch mask. An etching process is used, with the mask layer present on the top surface of the deposited layer, to form the emitter fingers 22-25, 26-29, and 30-33 from the deposited layer at the locations of the stripes in the pattern. The etching process may be conducted in a single etching step or multiple steps, and may rely on one or more etch chemistries. The mask layer may be removed after the emitter fingers 22-25, 26-29, and 30-33 are formed by the etching process. If comprised of a photoresist, the mask layer may be removed by ashing or solvent stripping, followed by a conventional cleaning process.

The portions of the base layer 20 covered by the emitter fingers 22-25, 26-29, and 30-33 may define an intrinsic base that forms a junction with the emitter, and that forms another junction with the collector 14. Portions of the base layer 20 that are not covered by the emitter fingers 22-25, 26-29, and 30-33 may be doped (e.g., by ion implantation) to define an extrinsic base with enhanced electrical conductivity after dopant activation. Spacers 15 may be formed on the vertical sidewalls of the emitter fingers 22-25, 26-29, and 30-33 by etching one or more dielectric layers (e.g., silicon dioxide or silicon nitride ($Si_3N_4$)) with an anisotropic etching process.

The resulting device structure 10 is a bipolar junction transistor that includes multiple emitter fingers 22-25, 26-29, and 30-33, the collector 14, and the portion of the base layer 20 (i.e., intrinsic base) that is vertically between the emitter fingers 22-25, 26-29, and 30-33 and the collector 14. The emitter fingers 22-25 in cell 36, the emitter fingers 26-29 in cell 38, and the emitter fingers 30-33 in cell 40 are connected in parallel at the back-end-of-line wiring levels or levels. The device structure 10 may be characterized as a heterojunction bipolar transistor (HBT) if two or all three of the semiconductor materials comprising the emitter fingers 22-25, 26-29, and 30-33, the collector 14, and the base layer 20 have different compositions. During the front-end-of-line (FEOL) portion of the fabrication process, the device structure 10 is replicated across at least a portion of the surface area of the substrate 11. In BiCMOS integrated circuits, complementary metal-oxide-semiconductor (CMOS) transistors may be formed using other regions of the substrate 11, and may be protected while bipolar junction transistors are formed. As a result, bipolar junction transistors (or HBTs) and CMOS transistors may be available and co-located on the same substrate 11.

In an alternative embodiment, the device structure 10 may include only a single cell 38 that includes emitter fingers 26-29. In an alternative embodiment, the device structure 10 may include any number of cells ("N") or an array containing multiple rows ("M") each including any number of cells ("N").

Standard middle-of-line (MOL) processing and back-end-of-line (BEOL) processing follows, which includes formation of dielectric layers, via plugs, and wiring for an interconnect structure coupled with the device structure 10, as well as other similar contacts for additional device structures 10 and CMOS transistors that may be included in other circuitry of the chip 76. Wiring formed by middle-of-line processing and back-end-of-line processing may couple the emitter fingers 22-25, 26-29, and 30-33 in parallel with other circuitry on the chip 76 or off the chip 76.

The emitter fingers 22-25, 26-29, and 30-33 are arranged lengthwise parallel to each other with emitter fingers 22-25 located in a cell 36 at the periphery of the device structure 10, emitter fingers 30-33 located in a cell 40 at the periphery of the device structure 10, and emitter fingers 26-29 centrally located in a cell 38 between the peripheral cells 36, 38.

At least one row of base contacts 41 is located between each pair of emitter fingers 22-33 and at the peripheral side edges of each of the cells 36, 38, 40. In cell 36, the middle emitter fingers 23, 24 are located laterally between the side emitter fingers 22, 25. In cell 38, the middle emitter fingers 27, 28 are located laterally between the side emitter fingers 26, 29. In cell 40, the middle emitter fingers 31, 32 are located laterally between the side emitter fingers 30, 33. Collector contact regions 16 and 19 are located at the side edges of the device structure 10. Collector contact region 17 is located between cell 36 and cell 38, and collector contact region 18 is located between cell 38 and cell 40.

The emitter fingers 22-25, 26-29, and 30-33 are characterized by at least one parameter relating to their size (e.g., width) and/or placement (e.g., spacing). The widths of the emitter fingers 22-25, 26-29, and 30-33 may be assessed in a direction transverse to the respective lengths (which may be equal), and the emitter-emitter spacings may be assessed in a direction parallel to the widths. As a result, the sum of the widths and spacings of emitter fingers 22-25 multiplied by their equal lengths defines the area of cell 36, the sum of the widths and spacings of emitter fingers 26-29 multiplied by their equal lengths defines the area of cell 38, and the sum of the widths and spacings of emitter fingers 30-33 multiplied by their equal lengths defines the area of cell 40.

The emitter fingers 22-25 may be characterized by respective individual widths W1-W4, the emitter fingers 26-29 may be characterized by respective individual widths W5-W8, and the emitter fingers 30-33 may be characterized by respective individual widths W9-W12. The emitter fingers 22-25 in cell 36 are separated by respective individual emitter-emitter spacings S1-S3. In particular, emitter finger 22 is separated by spacing S1 from emitter finger 23, emitter finger 23 is separated by spacing S2 from emitter finger 24, and emitter finger 24 is separated by spacing S3 from emitter finger 25. Similarly, the emitter fingers 26-29 in cell 38 are separated by respective individual emitter-emitter spacings S4-S6, and the emitter fingers 30-33 in cell 40 are separated by respective individual emitter-emitter spacings S7-S9. The widths W1-W12 and emitter-emitter spacings S1-S9 are variable quantities that can be individually selected to tune the thermal properties and temperature profile of each of the cells 36, 38, 40 and the device structure 10 with respect to objects on the substrate 11 that influence the temperature of the emitter fingers 22-25, 26-29, and 30-33. The total number of emitter fingers 22-25, 26-29, and 30-33 and the number of emitter fingers respectively included in each of the cells 36, 38, 40 may vary according to the device design.

The widths and/or spacings of the emitter fingers 22-25, 26-29, and 30-33 may be selected to lower the temperature profile across the chip package and to provide an improved temperature uniformity profile across the chip package. Width and/or spacing requirements are different considering the presence of a heat sink, such as the heat sinks 46, 48, 50 or an insulator, such as the package and its package element 54.

As best shown in FIG. 1, the emitter fingers 22-25, 26-29, and 30-33 of the device structure 10 are located in the area 44 on the chip 76. When powered during operation, the emitter fingers 22-25, 26-29, and 30-33 emit heat energy that is transported away from the area 44 by various thermal pathways comprised of various structures, such as heat sinks, package elements, heat sources, etc. The thermal pathways end at an external surface of the chip package that transfers the heat energy to the environment surrounding the chip package for dissipation.

The emitter fingers 22-25, 26-29, and 30-33 of the device structure 10 may be located on the chip 76 at given distances, $d_1$, from heat sinks 46, 48, 50. The device structure 10 may be directly connected with one or more of the heat sinks 46, 48, 50 and, in the representative embodiment, is directly connected with heat sink 46 and heat sink 48.

Different cells 36, 38, 40 of the device structure 10 may be located on the substrate 11 at different distances from each of the heat sinks 46, 48, 50. In the representative embodiment, cell 36 is located closer to heat sink 46 than cells 38, 40, cell 40 is located closer to heat sink 48 than cells 36, 38, and cell 38 is located equidistant from heat sink 46 and heat sink 48. Different cells 36, 38, 40 and the emitter fingers 22-25, 26-29, and 30-33 in the cells 36, 38, 40 are located at different distances from other heat sinks, such as heat sink 50. The differences in the distances may be present with finer granularity than on the coarser-scale level of the cells 36, 38, 40. Within cell 36, the different emitter fingers 22-25 and different portions of each of the emitter fingers 22-25 may be located at different distances from each of the heat sinks 46, 48, 50. Similarly, the emitter fingers 26-29 within cell 38 and their different portions may be located at different distances from each of the heat sinks 46, 48, 50, and the emitter fingers 31-33 within cell 40 and their different portions may be located at different distances from each of the heat sinks 46, 48, 50.

The emitter fingers 22-25, 26-29, and 30-33 of the device structure 10 may also be located on the chip 76 at a given distance, $d_3$, from the one or more heat sources 52. Different cells 36, 38, 40 and the emitter fingers 22-25, 26-29, and 30-33 in the cells 36, 38, 40 of the device structure 10 may be located on the substrate 11 at different distances, $d_3$, from each of the heat sources 52. In the representative embodiment, cell 36 is located closer to the heat source 52 than cells 38, 40, cell 38 is located closer to heat source 52 than cell 40, and cell 40 is located at the greatest distance from heat source 52. The differences in the distances may be present with finer granularity than on the coarser-scale level of the cells 36, 38, 40. Within cell 36, the different emitter fingers 22-25 and different portions of each of the emitter fingers 22-25 may individually be located at different distances from each of the heat sources 52. Similarly, the emitter fingers 26-29 within cell 38 and their different portions may be located at different distances from each of the heat sources 52, and the emitter fingers 30-33 within cell 40 and their different portions may be located at different distances from each of the heat sources 52.

Different cells 36, 38, 40 and the emitter fingers 22-25, 26-29, and 30-33 in the cells 36, 38, 40 of the device structure 10 may be located on the substrate 11 at different distances from the package element 54. In the representative embodiment, cell 36 is located at the greatest distance from package element 54 than cells 38, 40, cell 38 is located closer to package element 54 than cell 36, and cell 40 is located at the shortest distance from package element 54. Within cell 36, the different emitter fingers 22-25 and different portions of each of the emitter fingers 22-25 may individually be located at different distances, $d_2$, from the package element 54. Similarly, the emitter fingers 26-29 within cell 38 and their different portions may be located at different distances from the package element 54, and the emitter fingers 31-33 within cell 40 and their different portions may be located at different distances from the package element 54.

The various distances of the different cells 36, 38, 40 and the emitter fingers 22-25, 26-29, and 30-33 in the cells 36, 38, 40 from each of the heat sources 52, the heat sinks 46, 48, 50, and/or the package element 54 are such that the widths and/or the spacings can influence the operating temperatures of the emitter fingers 22-25, 26-29, and 30-33. The temperature variation for the emitter fingers 22-25, 26-29, and 30-33 across the device structure 10 in a chip package can be optimized through the selection of dimensions and/or pitches for the emitter fingers 22-25, 26-29, and 30-33 as part of a thermal management process that reduces the occurrence of areas on the chip 76 with operating temperatures that are greater than the operating temperatures of other areas on the chip 76. In an embodiment, the widths and/or the spacings of the emitter fingers 22-25, 26-29, and 30-33 may be selected to reduce the temperature variation within the device structure 10 and the temperature variation across the chip 76 when compared with other areas of heat generation on the chip 76 when packaged and operating.

During operation, the emitter fingers 22-25, 26-29, and 30-33 experience a temperature rise arising from power dissipation and Joule heating as electrical current is transferred through them, such as during operation as a power amplifier or a low-noise amplifier. When powered, the emitter fingers 22-25, 26-29, and 30-33 represent heat sources that emit heat energy. As described by the law of heat conduction (e.g., Fourier's law), the emitted heat energy from the emitter fingers 22-25, 26-29, and 30-33 will be transferred through intervening solid material (e.g., through the dielectric material and wiring of the interconnect structure and/or through the substrate 11) toward colder bodies, such as the heat sinks 46. As also described by Fourier's law, heat energy from other powered objects, such as the heat sources 52, may heat the emitter fingers 22-25, 26-29, and 30-33 and/or contribute to increasing the temperature of the solid material conducting the emitted heat energy from the emitter fingers 22-25, 26-29, and 30-33. The thermal barrier provided by the package element 54 may also affect the thermal conduction of heat energy away from the emitter fingers 22-25, 26-29, and 30-33 by confining the emitted heat energy from the emitter fingers 22-25, 26-29, and 30-33 so that the temperature of the solid material rises as the heat energy lacks a path for dissipation.

The design for the device structure 10 may consider thermal insulation from the package element 54, heat flow from the emitter fingers 22-25, 26-29, and 30-33 through each of heat sinks 46, 48, 50, and the heat energy contributed by the heat sources 52. Through selection of, among other factors, the widths W1-W12 and emitter-emitter spacings S1-S9 of the emitter fingers 22-25 in cell 36, the emitter fingers 26-29 in cell 38, and the emitter fingers 30-33 in cell 40, the temperature may be more uniform across of the device structure 10, although the temperature might not be uniform for each of the emitter fingers 22-25, 26-29, and 30-33 or each of the cells 36, 38, 40. Emitter fingers 22-25, 26-29, and 30-33 in cells 36, 38, 40 close to the package element 54 may have narrower widths and may have larger spacings. Emitter fingers 22-25, 26-29, and 30-33 in cells 36, 38, 40 close to heat sinks 46, 48, 50 may have wider widths and may have smaller spacings. The result of the determination is a device structure 10 having multiple different widths and multiple different emitter-emitter spacings for the emitter fingers 22-25, 26-29, and 30-33 across the entire device structure 10.

With reference to FIG. 3 in which like reference numerals refer to like features in FIGS. 1, 2, 2A, a determination of an adjustment to the spacings S1-S9 that takes into account the proximity of the heat sinks 46, 48 may be illustrated for the emitter fingers 22-25, 26-29, and 30-33 in cells 36, 38, 40 of the device structure 10. Specifically, in view of the greater separation of the heat sinks 46, 48 from cell 38 than cells 36, 40, the emitter spacing of the emitter fingers 26-29 in cell 38 may be modified relative to the spacings for the emitter fingers 22-25 in cell 36 and the spacings for the emitter fingers 26-29 in cell 40. For the representative cell 38, the spacings are adjusted such that the spacing S5 between emitter finger 27 and emitter finger 28 is greater than the spacing S4 between emitter finger 26 and emitter finger 27 and is greater than the spacing S6 between emitter finger 28 and emitter finger 29. Due to the increasing value of the spacing S5, multiple rows of base contacts 41 can be located between emitter finger 27 and emitter finger 28.

This exemplary embodiment reflects that the emitter fingers 27, 28 in cell 38 can be fabricated with a spacing S5 that is greater than the spacings S1-S3 in cell 36 and that is greater than the spacings S7-S9 in cell 40 (FIG. 2). The relative increase in spacing S5 may reduce the operating temperature of the emitter fingers 26-29 in cell 38 in comparison with the emitter fingers 22-25 in cell 36 and the emitter fingers 30-33 in cell 40. The temperature reduction may improve temperature uniformity across the device structure 10 because heat energy is dissipated less efficiently from cell 38 to the heat sinks 46, 48 due to the greater distance in the path for heat conduction from cell 38 in comparison with cell 36 and cell 40, which have shorter paths for heat conduction to the heat sinks 46, 48.

Generally, for the exemplary embodiment of FIG. 3, the greater proximity of the heat sinks 46, 48 to cell 36 and cell 40 than to cell 38 may result in the need to increase one or more of the spacings S4, S5, S6 of the emitter fingers 26-29 compared with the spacings S1, S2, S3 of the emitter fingers 22-25 and/or the spacings S7, S8, S9 of the emitter fingers 30-33. In other words, the emitter fingers 26-29 may have one or more spacings that are greater than the spacings for the emitter fingers 22-25 and/or the spacings for the emitter fingers 30-33. Alternatively, the greater proximity of the heat sinks 46, 48 to cell 36 and cell 40 than to cell 38 may result in the need to decrease one or more of the widths W5, W6, W7, W8 of the emitter fingers 26-29 compared with the widths W1, W2, W3, W4 of the emitter fingers 22-25 and/or the widths W9, W10, W11, W12 of the emitter fingers 30-33. In other words, the emitter fingers 26-29 may have one or more widths that are greater than the emitter fingers 22-25 and/or emitter fingers 30-33. Eliminating one or the other of the heat sinks 46, 48 would change the determination of the spacings and/or widths that take into account the relative proximity to the remaining one of the heat sinks 46, 48.

Figure 4:
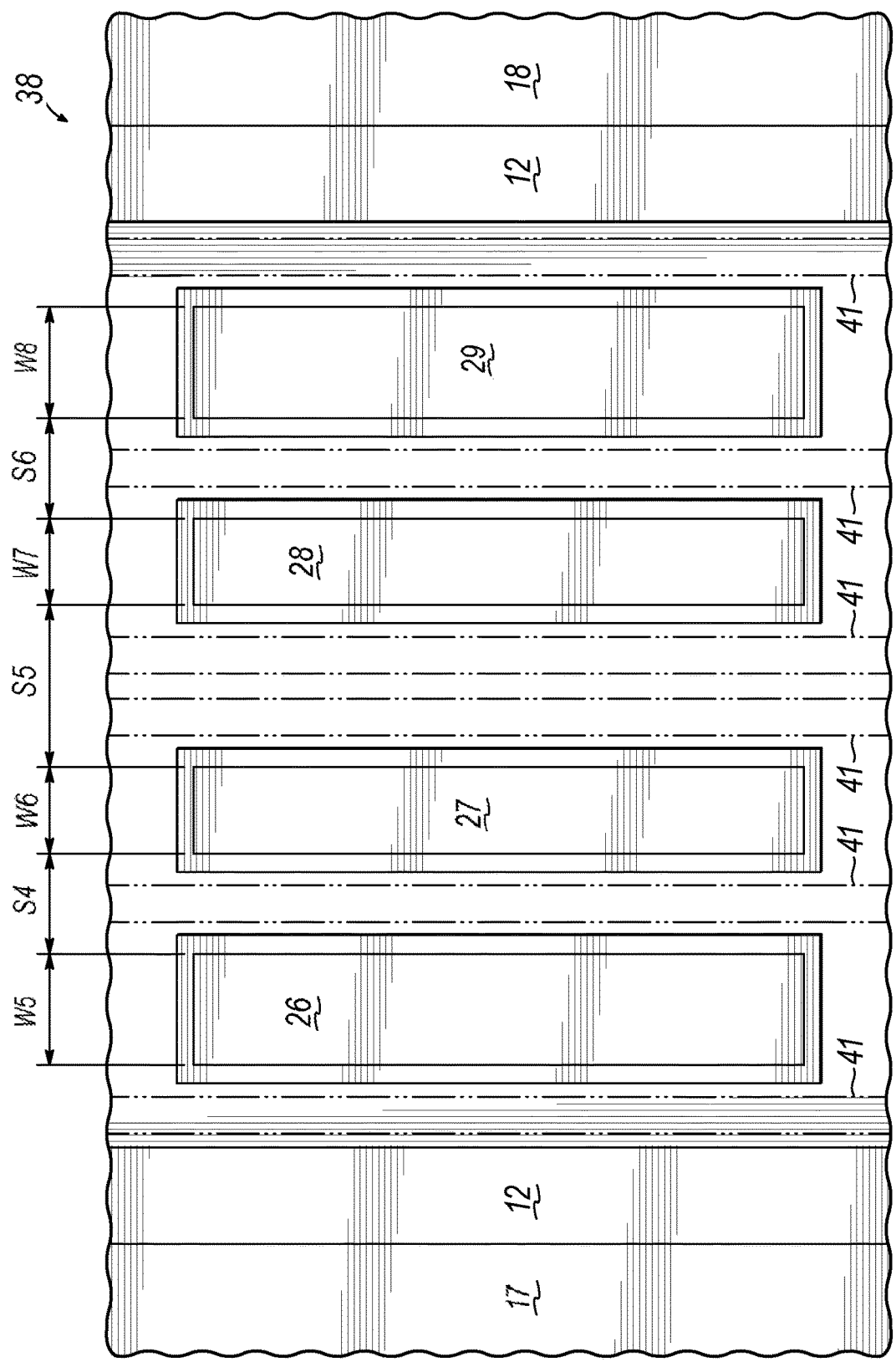

With reference to FIG. 4 in which like reference numerals refer to like features in FIGS. 1, 2, 2A, 3, a determination of an adjustment to the widths W1-W12 that takes into account the proximity of the package element 54 may be illustrated for the emitter fingers 22-25, 26-29, and 30-33 in cells 36, 38, 40 of the device structure 10. Specifically, in view of the greater separation of the heat sinks 46, 48 from cell 38 than cells 36, 40, the widths of the emitter fingers 26-29 in cell 38 may be modified relative to the widths for the emitter fingers 22-25 in cell 36 and the widths for the emitter fingers 30-33 in cell 40. For the representative cell 38, the width W6 of emitter finger 26 and the width W7 of emitter finger 27 are adjusted to be less than the width W5 of emitter finger 25 and the width W8 of emitter finger 29. In the representative embodiment, the decrease in the widths W6, W7 relative to widths W5, W8 are used in combination with the increased value of the spacing S5 relative to spacings S4, S6. However, in an alternative embodiment, the widths W6, W7 may be decreased relative to widths W5, W8 and the spacings S4, S5, S6 may be equal.

This exemplary embodiment reflects that the emitter fingers 27, 28 in cell 38 can be fabricated with widths W6, W7 that are less than the widths W1-W4 of emitter fingers 22-25 in cell 36 and the widths W9-W12 of emitter fingers 30-33 in cell 40 (FIG. 2). The relative reduction in the widths W6, W7 may reduce the power dissipation and temperature rise in emitter fingers 26-29 in cell 38 in comparison with the emitter fingers 22-25 in cell 36 and the emitter fingers 30-33 in cell 40. The temperature reduction may improve temperature uniformity across the device structure 10 as cell 38 is further away from heat sinks 46 and 48 compared to cells 36 and 40 resulting in a higher thermal resistance for heat dissipation.

Combinations of adjustments to the widths W1-W12 and the spacings S1-S9 of the emitter fingers 22-25, 26-29, and 30-33 may be required to account for the presence of both heat sinks and heat-insulating packaging. The simplified situations in FIGS. 3 and 4 would be combined in some manner by the width/spacing computation to reflect this more complex situation.

Figure 5:
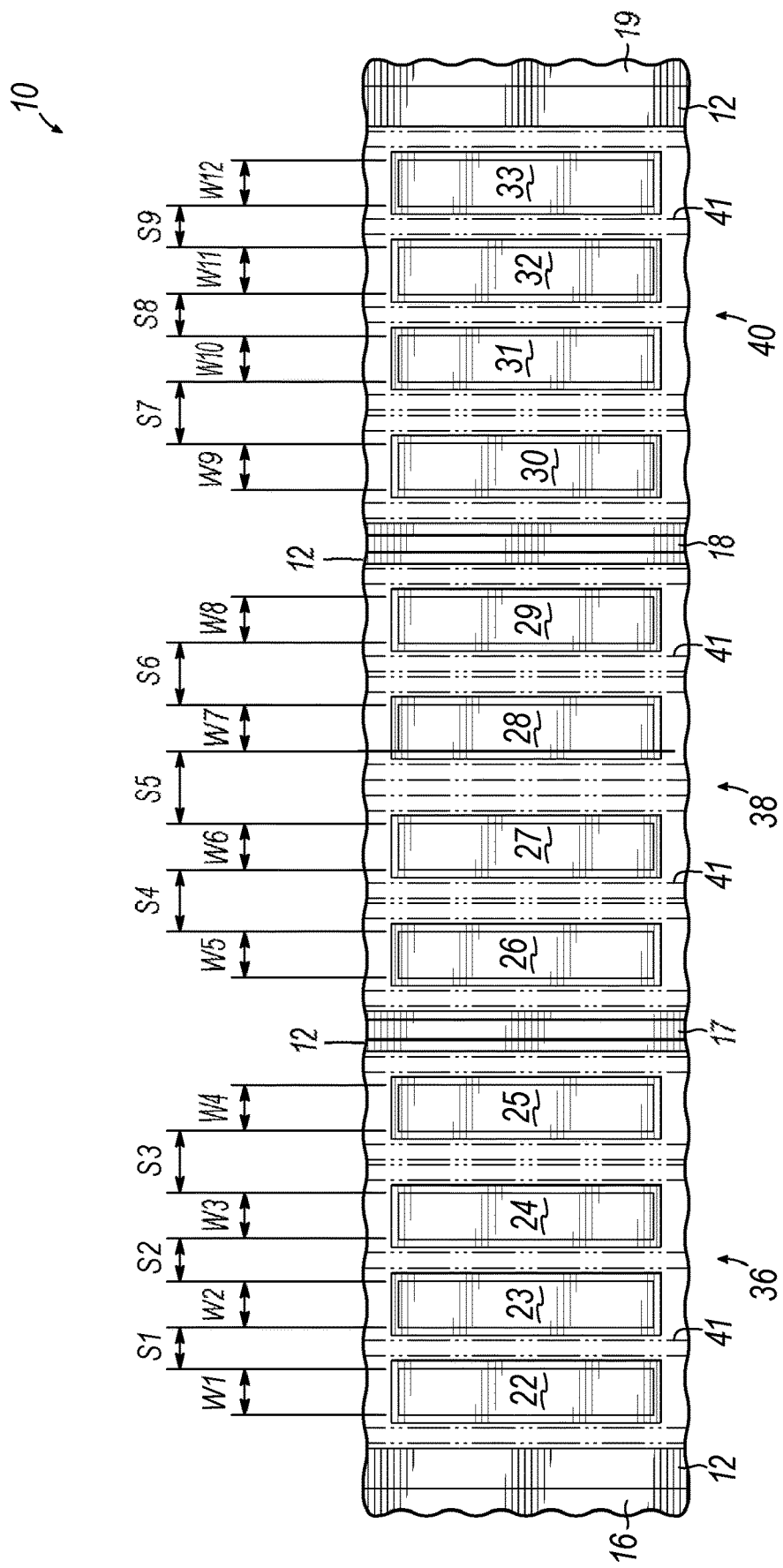
FIGS. 5 and 6 are top views of device structures similar to FIG. 2 in accordance with alternative embodiments of the invention.

With reference to FIG. 5 in which like reference numerals refer to like features in FIGS. 1, 2, 2A, 3, the spacings S1-S9 may be adjusted within the cells 36, 38, 40 across the device structure 10 so that each of the cells includes multiple different spacings that are to provide improved temperature uniformity. For the representative cells 36, 38, and 40, the spacings are adjusted such that the spacing S5 is greater than the spacings S1-S4 and S6-S9, and spacings S3, S4, S6, S7 are greater than the spacings S1, S2, S8, S9. The spacings S1-S12 decrease in proportion to the distance d1 separating the emitter fingers 22-33 from the heat sinks 46, 48 (FIG. 1). This variation reflects the generalization that emitter fingers closer to a heat sink may have a spacing that is less than the spacing for emitter fingers located at greater distance from the heat sink.

Figure 6:
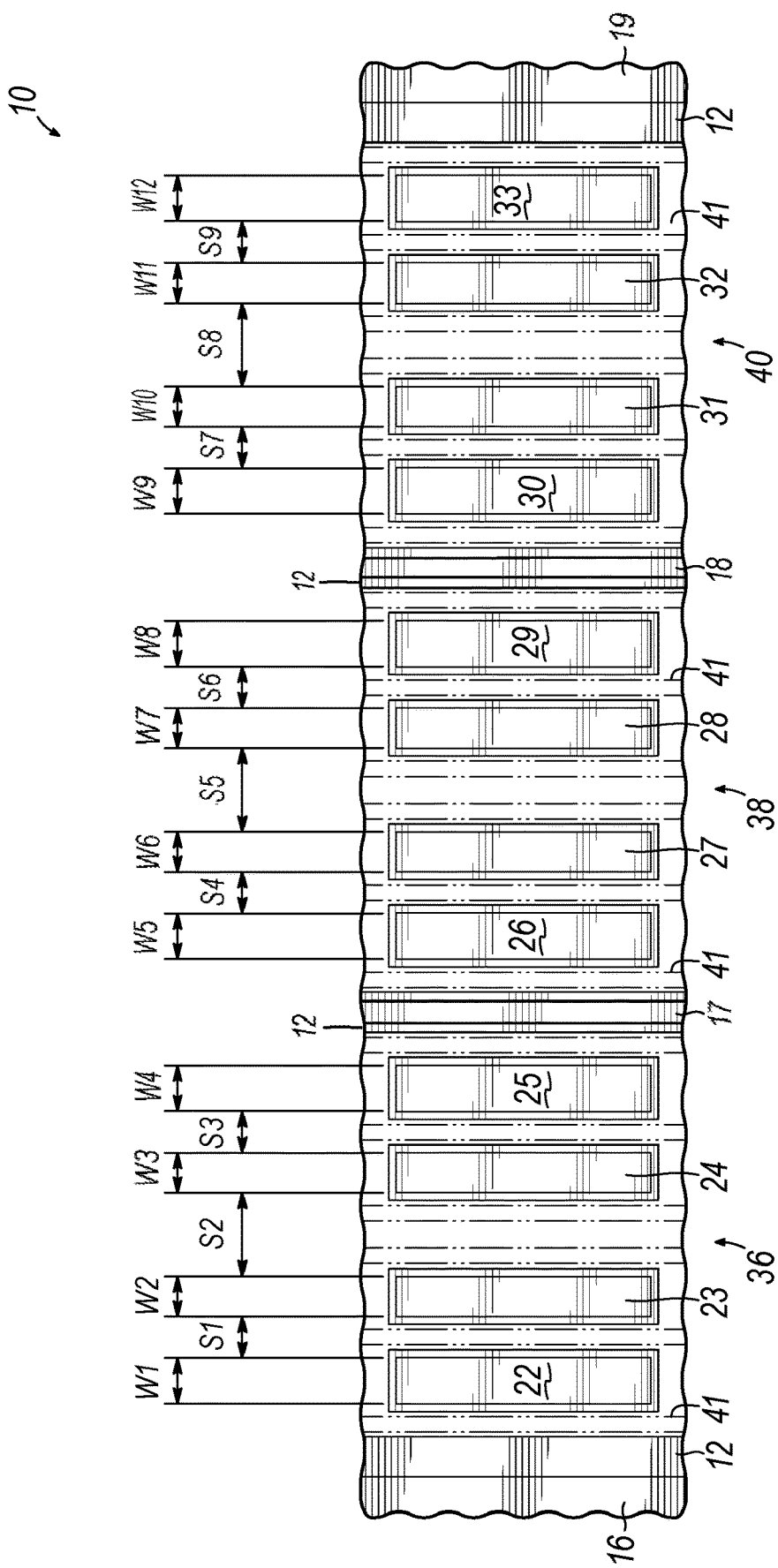

With reference to FIG. 6 in which like reference numerals refer to like features in FIGS. 1, 2, 2A, 3, the widths W1-W12 may be adjusted within the cells 36, 38, 40 across the device structure 10 so that each of the cells includes multiple different widths that are to provide may be modified to vary the emitter width. For the representative cells 36, 38, 40, the widths are adjusted such that widths W2, W3, W6, W7, W10, W11 are less than the widths W1, W4, W5, W8, W9, W12. The widths W1-W4 in cell 36 decrease in proportion to the distance d1 separating the emitter fingers 22-25 from the heat sinks 46, 48 (FIG. 1). The widths W5-W8 in cell 38 decrease in proportion to the distance d1 separating the emitter fingers 26-29 from the heat sinks 46, 48. The widths W9-W12 in cell 40 decrease in proportion to the distance d1 separating the emitter fingers 30-33 from the heat sinks 46, 48 (FIG. 1). This variation reflects the generalization that emitter fingers within each of the cells 36, 38, 40 closer to one or the other of the heat sinks 46, 48 (FIG. 1) may have a width that is greater than the width for emitter fingers located at greater distance from the heat sink.

Figure 7:
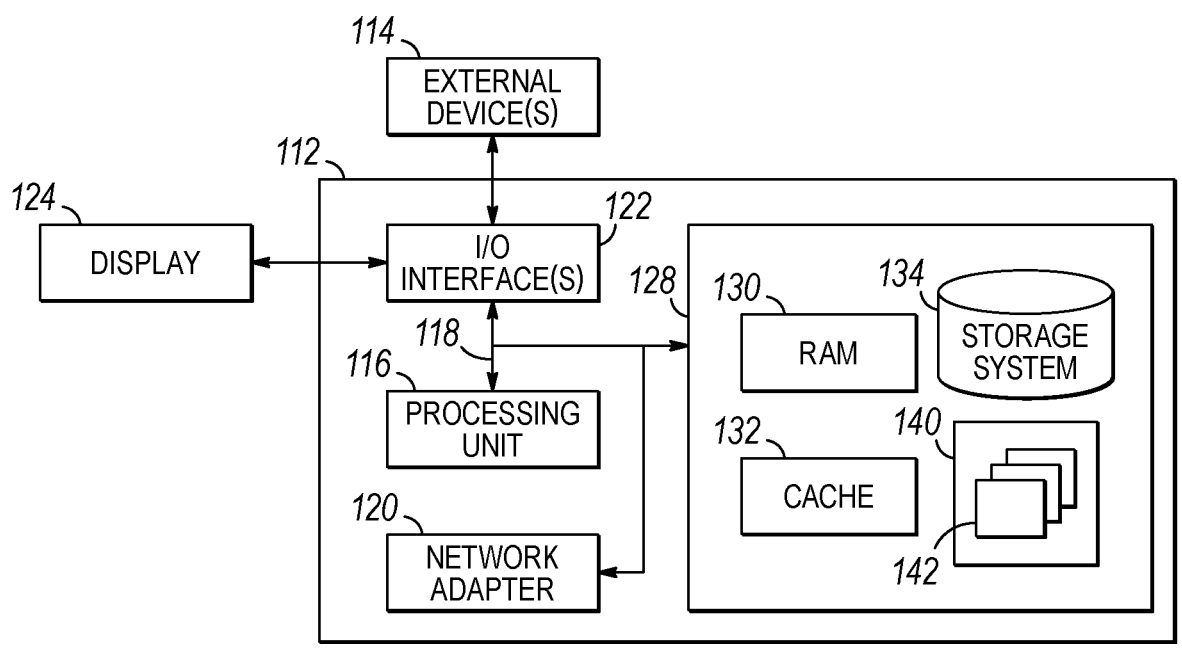
FIG. 7 is a diagrammatic view of an exemplary computer system configured to determine the parameterization of the emitter fingers and cells consistent with the embodiments of the invention.

Referring now to FIG. 7, a schematic of an exemplary computer system 112 is shown. The computer system 112 may include one or more processors or processing units 116, a system memory 128, and a bus 118 that couples various system components including system memory 128 to each processing unit 116. Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA)

bus, Enhanced ISA (EISA) bus, Video Electronics Standards Association (VESA) local bus, and Peripheral Component Interconnect (PCI) bus.

Computer system 112 typically includes a variety of computer system readable media. Such media may be any available media that is accessible by computer system 112, and it includes both volatile and non-volatile media, removable and non-removable media.

System memory 128 can include computer system readable media in the form of volatile memory, such as random access memory (RAM) 130 and/or cache memory 132. Computer system 112 may further include other removable/non-removable, volatile/non-volatile computer system storage media. By way of example only, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 118 by one or more data media interfaces. As will be further depicted and described below, system memory 128 may include at least one program product having a set (e.g., at least one) of program modules that are configured to carry out the functions of embodiments of the invention.

Program/utility 140, having a set (at least one) of program modules 142, may be stored in system memory 128 by way of example, and not limitation, as well as an operating system, one or more application programs, other program modules, and program data. Each of the operating system, one or more application programs, other program modules, and program data or some combination thereof, may include an implementation of a networking environment. Program modules 142 generally carry out the functions and/or methodologies of embodiments of the invention as described herein.

Computer system 112 may also communicate with one or more external devices 114 such as a keyboard, a pointing device, a display 124, etc.; one or more devices that enable a user to interact with computer system 112; and/or any devices (e.g., network card, modem, etc.) that enable computer system 112 to communicate with one or more other computing devices. Such communication can occur via Input/Output (I/O) interfaces 122. Still yet, computer system 112 can communicate with one or more networks such as a local area network (LAN), a general wide area network (WAN), and/or a public network (e.g., the Internet) via network adapter 120. As depicted, network adapter 120 communicates with the other components of computer system 112 via bus 118. It should be understood that although not shown, other hardware and/or software components could be used in conjunction with computer system 112. Examples, include, but are not limited to: microcode, device drivers, redundant processing units, external disk drive arrays, RAID systems, tape drives, and data archival storage systems, etc.

Thermal modeling software may be included among the program modules 142 and may be used by the computer system 112 to evaluate the placement of the emitter fingers. Among the variables that may be computed are the spacing and width of the emitter fingers, as well as the separation between the cells of emitter fingers and different objects that influence the transfer and dissipation of heat energy. As discussed herein, those objects may include heat sources, heat sinks, and thermal insulation that impedes or blocks the transfer of heat energy. The thermal modeling software may rely on numerical methods used in thermal analysis and, in an embodiment, may comprise a finite volume method that is found in computational fluid dynamics (CFD) software. Other varieties of thermal modeling software may rely on boundary element methods, finite difference methods, or finite element methods. One particular variety of CFD thermal analysis software is commercially available from ANSYS.

The chip package may be approximated in the thermal analysis as a thermal circuit, and the dissipating characteristics of the chip package modeled by a network of heat transfer pathways through which heat energy must flow. Heat energy must be conducted from the chip package through various thermal pathways to reach an outer surface of the package, which is exposed to an ambient air body, and then be dissipated to that ambient air body. Various packaging materials have unique thermal characteristics, such as thermal conductivity. The thermal conductivity of each material in the chip package determines the amount of heat that can be conducted through and away from that material.

The proximity of the device structure of the chip to heat sinks, package elements, and heat sources can influence the operating temperatures of the different emitter fingers. By considering the proximity of the emitter fingers to heat sinks, package elements, and heat sources, the widths and spacings of the emitter fingers may be optimized such that the area on the chip containing the device structure may not appear as an area of greater heat generation and higher temperature during operation (i.e., a hot spot) in the temperature profile compared with the operating temperature of other areas on the chip. The result is a higher uniformity in the temperature profile across the chip.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An assembly comprising:
    a chip package having an external surface;
    a chip inside the chip package, the chip including a bipolar junction transistor having a collector, a base layer on the collector, a first plurality of emitter fingers arranged in a first cell on a first portion of the base layer, a second plurality of emitter fingers arranged in a second cell on a second portion of the base layer, and a collector contact region separating the first cell from the second cell; and
    a first heat sink on the chip, the first heat sink configured to influence an operating temperature of the first plurality of emitter fingers and the second plurality of emitter fingers,
    wherein the first plurality of emitter fingers have a first plurality of different spacings within the first cell, the second plurality of emitter fingers have a second plurality of different spacings within the second cell, the first plurality of different spacings are different than the second plurality of different spacings, and the first cell and the second cell are spaced by different distances on the chip from the first heat sink.

2. The assembly of claim 1 wherein the first heat sink is a through-substrate via or a conductive via.

3. The assembly of 1 further comprising:
    a second heat sink on the chip, the second heat sink configured to influence the operating temperature of the first plurality of emitter fingers and the second plurality of emitter fingers.

4. The assembly of claim 3 wherein the first heat sink is directly connected with the bipolar junction transistor, and the second heat sink is directly connected with the bipolar junction transistor.

5. The assembly of claim 4 wherein the first heat sink and the second heat sink are through-substrate vias.

6. The assembly of claim 4 wherein the first heat sink and the second heat sink are conductive vias.

* * * * *